(12) United States Patent
Correale, Jr.

(10) Patent No.: US 6,861,873 B2
(45) Date of Patent: Mar. 1, 2005

(54) LEVEL TRANSLATOR CIRCUIT FOR POWER SUPPLY DISABLEMENT

(75) Inventor: Anthony Correale, Jr., Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/439,860

(22) Filed: May 16, 2003

(65) Prior Publication Data

US 2004/0227541 A1 Nov. 18, 2004

(51) Int. Cl.[7] .............................................. H03K 19/185
(52) U.S. Cl. .............................. 326/81; 326/68; 326/63; 327/333
(58) Field of Search .............................. 326/62, 63, 68, 326/81, 83; 327/333

(56) References Cited

U.S. PATENT DOCUMENTS

| | | |
|---|---|---|
| 5,298,808 A | 3/1994 | Terrell et al. |
| 5,378,943 A | 1/1995 | Dennard |
| 5,592,108 A | 1/1997 | Tsukahara |
| 5,973,549 A | 10/1999 | Yuh |
| 6,130,557 A | 10/2000 | Drapkin et al. |
| 6,265,896 B1 | 7/2001 | Podlesny et al. |
| 6,268,744 B1 | 7/2001 | Drapkin et al. |
| 6,605,963 B2 * | 8/2003 | Kitamoto et al. ............. 326/81 |
| 6,750,696 B2 * | 6/2004 | Shimada et al. ............ 327/333 |

OTHER PUBLICATIONS

*5–Volt Signal Level Shifter in a 3–Volt Cmos* Circuit, IBM Technical Disclosure Bulletin, Dec. 1989. pp. 454–55.

* cited by examiner

*Primary Examiner*—Vibol Tan
(74) *Attorney, Agent, or Firm*—Sawyer Law Group LLP; Scott W. Reid

(57) ABSTRACT

A level translator circuit for use between a transmitting voltage potential circuit and a receiving voltage potential circuit is disclosed. The translator circuit comprises a logic element coupled between the transmitting circuit and the receiving circuit for translating the voltage level. The logic element includes a device which has a threshold voltage of such a level that leakage current will be minimized when the transmitting voltage potential circuit's power supply is disabled. In one embodiment, the logic element comprises a multistage inverter wherein a first stage comprises an intermediate power supply. The intermediate power supply allows for the threshold voltage to be lower. Accordingly, a level translation circuit is provided that operates effectively even when one of the voltage potential circuits is turned off. In addition, leakage current is minimized for two distinct power supplies by providing a high threshold voltage device within the level translator of the circuit to ensure that an appropriate logical level is provided at the output of the circuit.

12 Claims, 8 Drawing Sheets

100

200

LEVEL TRANSLATOR CIRCUIT FOR POWER SUPPLY DISABLEMENT

CROSS-RELATED APLICATION

The present application is related to application Ser. No. 10/439,362 entitled "Level Translator Circuit for Power Supply Disablement," filed on even date herewith.

FIELD OF THE INVENTION

The present invention relates generally to a level translator circuit and more particularly to a level translator circuit for use between circuits having distinct power supplies wherein the lower voltage supply may be deactivated.

BACKGROUND OF THE INVENTION

Circuits for voltage level translation are utilized in a variety of applications. Level translator circuits are employed to allow circuits operating at different power supply potentials to communicate with one another. Typically, the area, power and performance of the translator circuit are critical to the operations of each of the different circuits.

FIG. 1 is a simple block diagram of a level translator system 10. The system 10 includes a level translator circuit 12 coupled between transmitting circuit 14 and downstream receiving circuit 16. In this embodiment, Vddl circuit 14 is coupled to a lower voltage supply and Vddh circuit 16 is coupled to a higher voltage supply. Level translation is required only when a circuit on a lower voltage supply interfaces with one on a higher voltage supply. The level translates due to the voltage difference between Vddl circuit 14 and Vddh circuit 16.

It is important that a level translator circuit operate efficiently, utilize minimal power, and translate from one voltage supply potential to another as quickly as possible. To conserve standby or leakage power it is important to be able to turn off the transmitting circuit, i.e. circuit 14. It is also important to be able to provide a valid Vddl and Vddh level and minimize leakage current at all times, even when the transmitting circuit 14 is disabled. For a more detailed description of this issue, refer now to the following discussion in conjunction with the accompanying figures.

FIG. 2 illustrates a first embodiment of a conventional level translator circuit 100 coupled between distinct power supplies. In this circuit, cross-coupled pfet transistors 102 and 106 connected to the Vddh circuit 16' are used in conjunction with pull-down nfet transistors 104 and nfet transistor 108 and an inverter 10 which is connected to the Vddl supply. The circuit 100 operates as follows: For propagation of a logical '0' from the Vddl circuit 14', transistor 104 is off, the inverter 110 produces a logical '1' at node-2 in the form of Vddl volts, which then turns on nfet transistor 108, driving node-Z to a logical '0', which in turn causes pfet transistor 102 to turn on, thereby raising node-1 to Vddh volts, which in turn causes pfet transistor 106 to turn off. Since the gate of nfet transistor 106 is at Vddh and the source of pfet transistor 106 is also at Vddh, there is no leakage. This circuit is non-inverting.

For propagation of a logical '1' from the Vddl circuit 14', nfet transistor 104 is on, resulting in node-1 being drawn toward a logical '0'. The inverter 110 produces a logical '0' at node 2 in the form of 0 volts, which results in nfet transistor 108 turning off. Since node-1 is being drawn to 0 volts, pfet transistor 106 is now on, driving node Z to a logical '1' in the form of Vddh volts, which in turn reinforces the node 1 potential of '0' by turning off pfet transistor 102.

Now, if Vddl circuit 14''s power were turned off, e.g., set to 0 volts to conserve power, while Vddh remained active, the output levels emanating from the Vddl circuit 14' would be 0 volts. In addition, the output of the inverter 110 within the level translator would also be at 0 volts. When the Vddl supply is active, differential levels are supplied to the nfet transistors 104 and 108 comprising the level translator. Now with the Vddl supply being cut off, both nfet transistors 104 and 108 now receive the same 0 volts. This results in the output, node Z and node 1 achieving Vddh−|Vtp|. This will result in leakage in the Vddh circuit 16' that is driving down stream.

FIG. 3 illustrates a second embodiment of a conventional level translator circuit 200 coupled between distinct power supplies. In this configuration, the inverter is eliminated and the source of nfet transistor 204 is connected to the gate input of the nfet transistor 208, which is connected to the output of the Vddl circuit 14''. Also, the gate of nfet transistor 204 is connected directly to the Vddl supply. This circuit 200 operates as follows: For propagation of a logical '0' from the Vddl circuit 14'', nfet transistor 204 is on and nfet transistor 208 is off, thereby relinquishing control of node Z. Since nfet transistor 204 is on, node 1 is now at 0-volts turning on pfet transistor 206, raising node-Z to Vddh volts, which in turn shuts off pfet transistor 202, which reinforces the node 1 level of 0 volts. Also note that this circuit configuration is inverting.

For propagation of a logical '1' from the Vddl circuit 14'', nfet transistor 204 is on until the voltage at node 1 can rise to Vddl−Vtn. This voltage rise begins to shut off pfet transistor 206. Nfet transistor 208 is now active and pulling node-Z low, which in turn activates pfet transistor 202, which raises the node 1 potential to Vddh, which in turn shuts off the leakage from pfet transistor 206. Once again, if Vddl were turned off, e.g., set to 0 volts to conserve power while Vddh remained active, all levels emanating from the Vddl circuit 14'' would be 0 volts.

What is needed therefore is a means to provide a downstream voltage level out of the level translator when the transmitting voltage potential circuit is shut off. The present invention addresses such a need.

SUMMARY OF THE INVENTION

A level translator circuit for use between a transmitting voltage potential circuit and a receiving voltage potential circuit is disclosed. The translator circuit comprises a logic element coupled between the transmitting circuit and the receiving circuit for translating the voltage level. The logic element includes a device which has a threshold voltage of such a level that leakage current will be minimized when the transmitting voltage potential circuit's power supply is disabled. In one embodiment, the logic element comprises a multistage inverter wherein a first stage comprises an intermediate power supply. The intermediate power supply allows for the threshold voltage to be lower.

Accordingly, a level translation circuit is provided that operates effectively even when one of the voltage potential circuits is turned off. In addition, leakage current is minimized for two distinct power supplies by providing a high threshold voltage device within the level translator of the circuit to ensure that an appropriate logical level is provided at the output of the circuit.

DETAILED DESCRIPTION

The present invention relates generally to a level translator circuit and more particularly to a level translator circuit for use between circuits having distinct power supplies wherein the lower voltage supply may be disabled. The following description is presented to enable one of ordinary skill in the art to make and use the invention and is provided in the context of a patent application and its requirements. Thus, the present invention is not intended to be limited to the embodiment shown, but is to be accorded the widest scope consistent with the principles and features described herein.

In the present invention, a logic element such as an inverter is provided as the translator. The logic elements include a high threshold voltage to ensure that the appropriate logic levels are provided to the receiving voltage potential circuit when the transmitting potential circuit is disabled. For a further discussion of the features of the present invention, refer now to the following description in conjunction with the accompanying figures.

Figure 1:
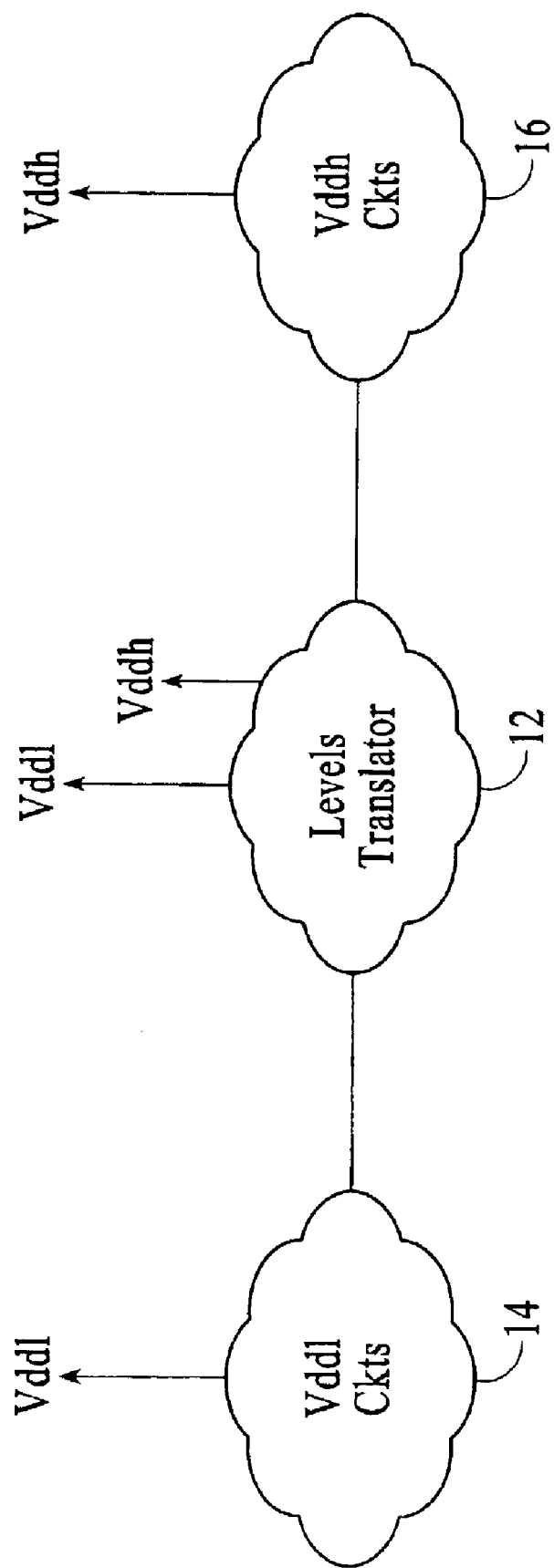
FIG. 1 is a simple block diagram of a level translator system.
Figure 2:
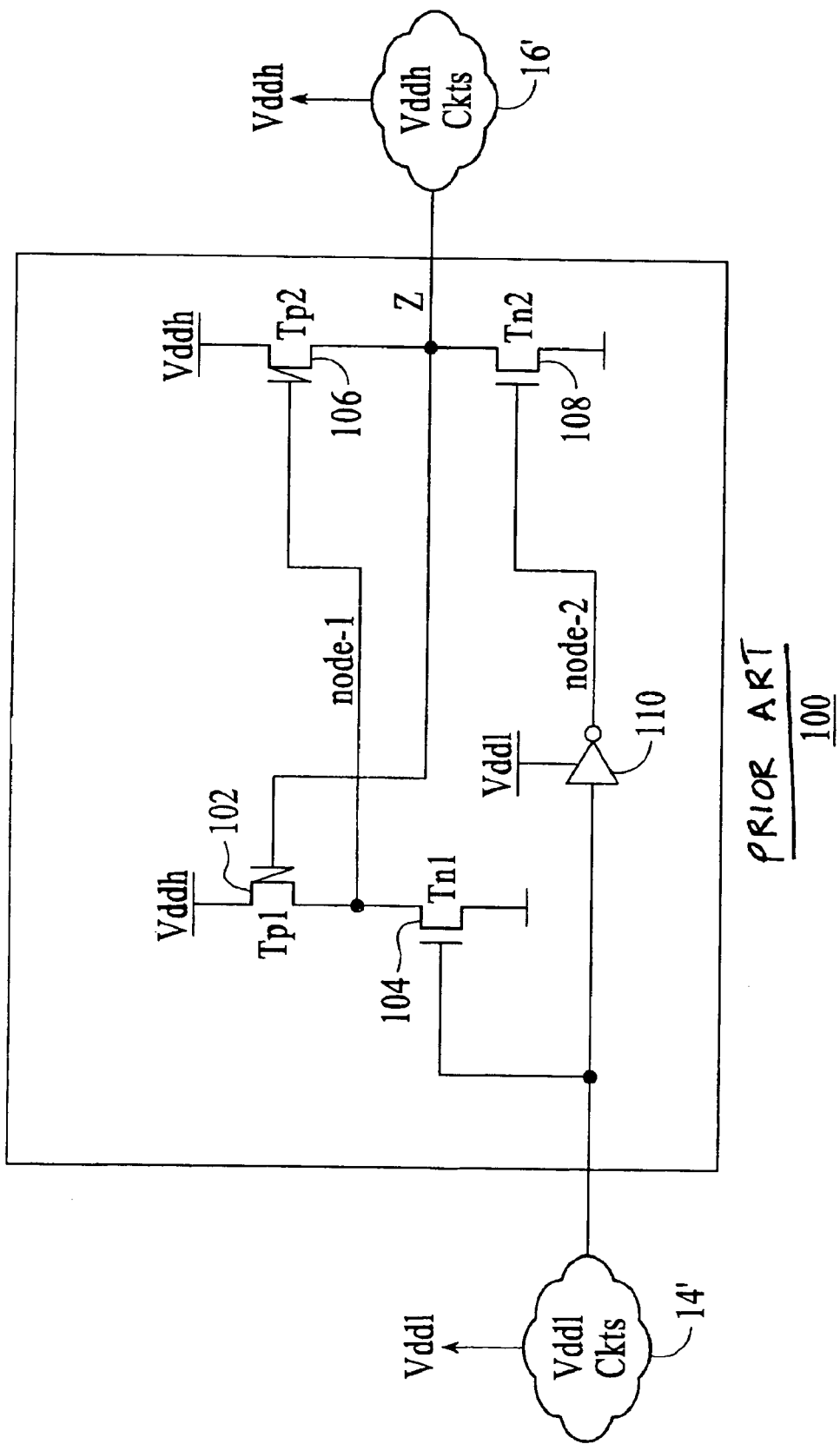
FIG. 2 illustrates a first embodiment of a conventional level translator circuit coupled between distinct power supplies.
Figure 3:
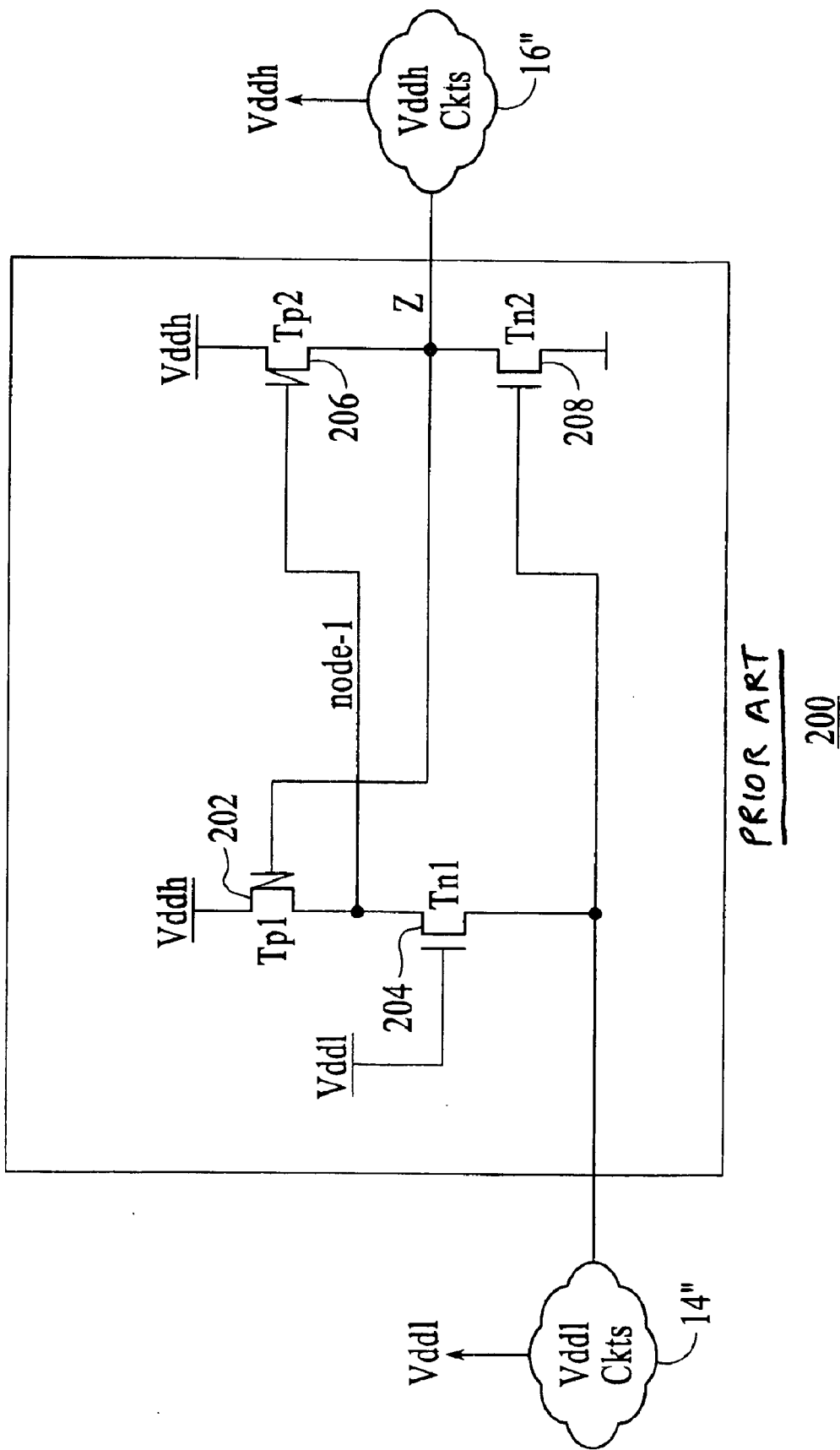
FIG. 3 illustrates a second embodiment of a conventional level translator circuit coupled between distinct power supplies.
Figure 4:
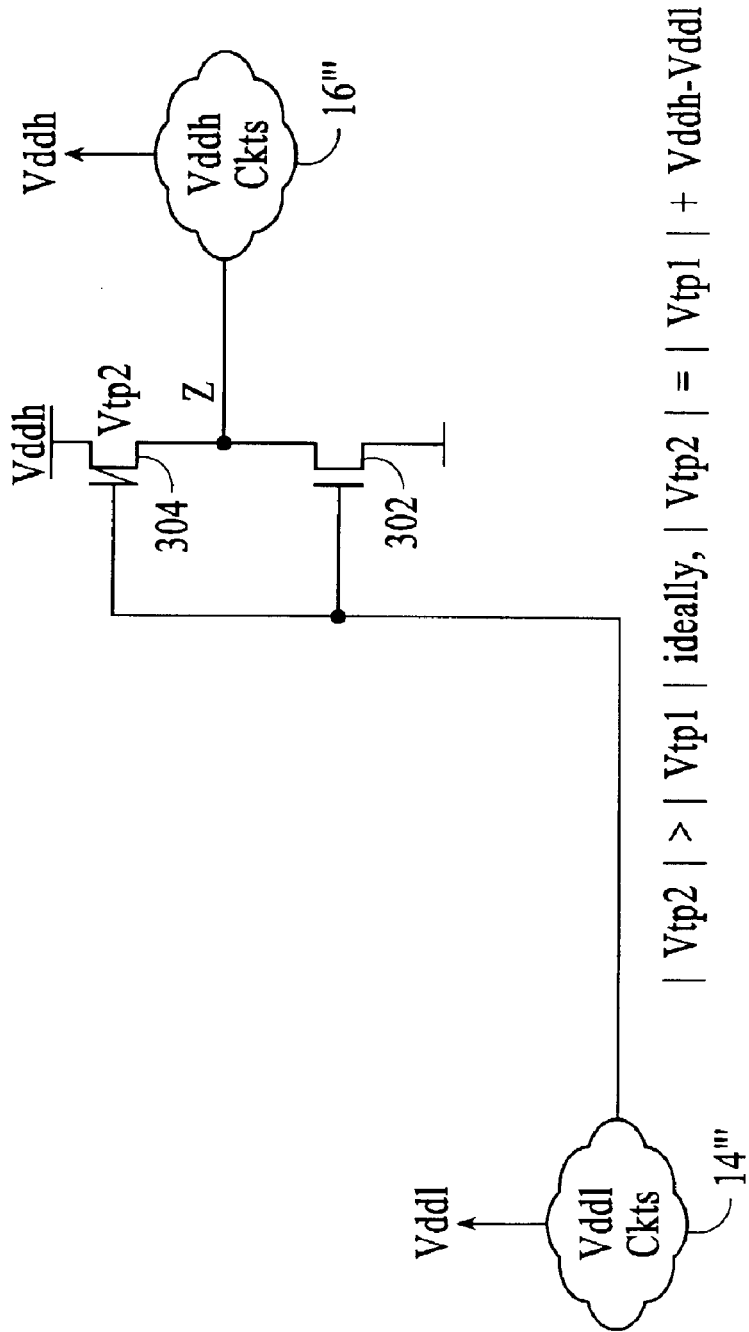
FIG. 4 is a first embodiment of a level translation circuit in accordance with the present invention.

FIG. 4 is a first embodiment of a level translator circuit 300 in accordance with the present invention. In this embodiment, the gate of nfet transistor 302 and the gate of pfet transistor 304 are coupled to the Vddl circuit 14''' to form a simple inverter. The Vddh circuits 16''' are coupled to the sources of the transistors 302 and 304. The pfet transistor 304 comprises a high threshold device which has a threshold voltage of Vtp2. The level translator circuit 300 operates as a normal inverter in Vddl active and inactive modes. By ensuring that |Vtp2| is greater than |Vtp1|+Vddh−Vddl, then no leakage current will exist.

Figure 5:
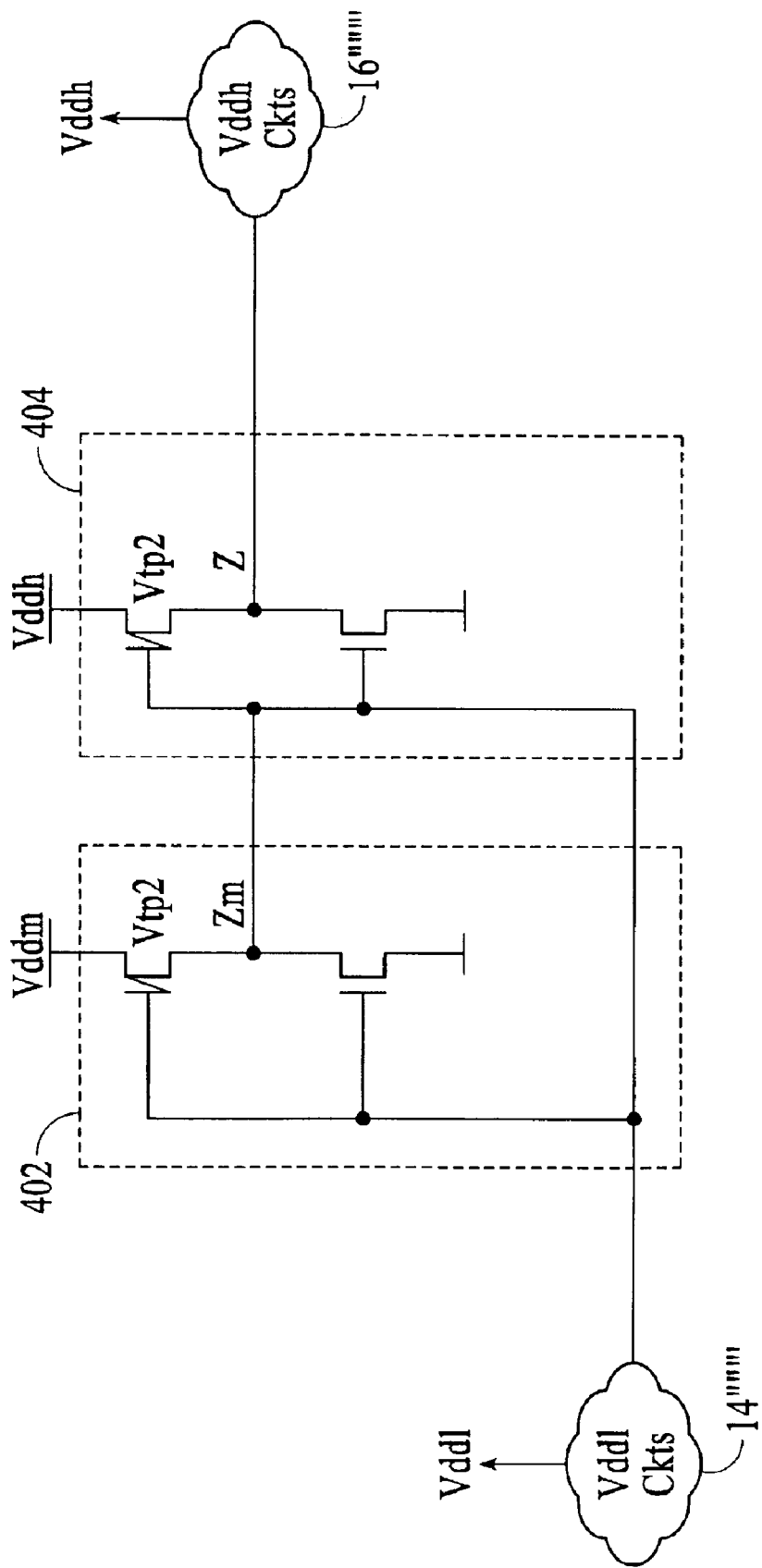
FIG. 5 is a second embodiment of a level translation circuit in accordance with the present invention.

FIG. 5 is a second embodiment of a level translation circuit 400 in accordance with the present invention. FIG. 5 illustrates the use of two stages of inverters 402 and 404 for level translation. The first stage includes an intermediate voltage power supply (Vddm).

If the reference voltage (Vddm) is Vddl+½(Vddh−Vddl), then a 2-stage level translator could be employed. This results in a |Vtp2| not needing to be so much higher than |Vtp1|. Also, since Vddm is derived from Vddh, Vddm will track Vddh and the issues associated with deactivation of Vddm while Vddh is active are resolved.

Figure 6:
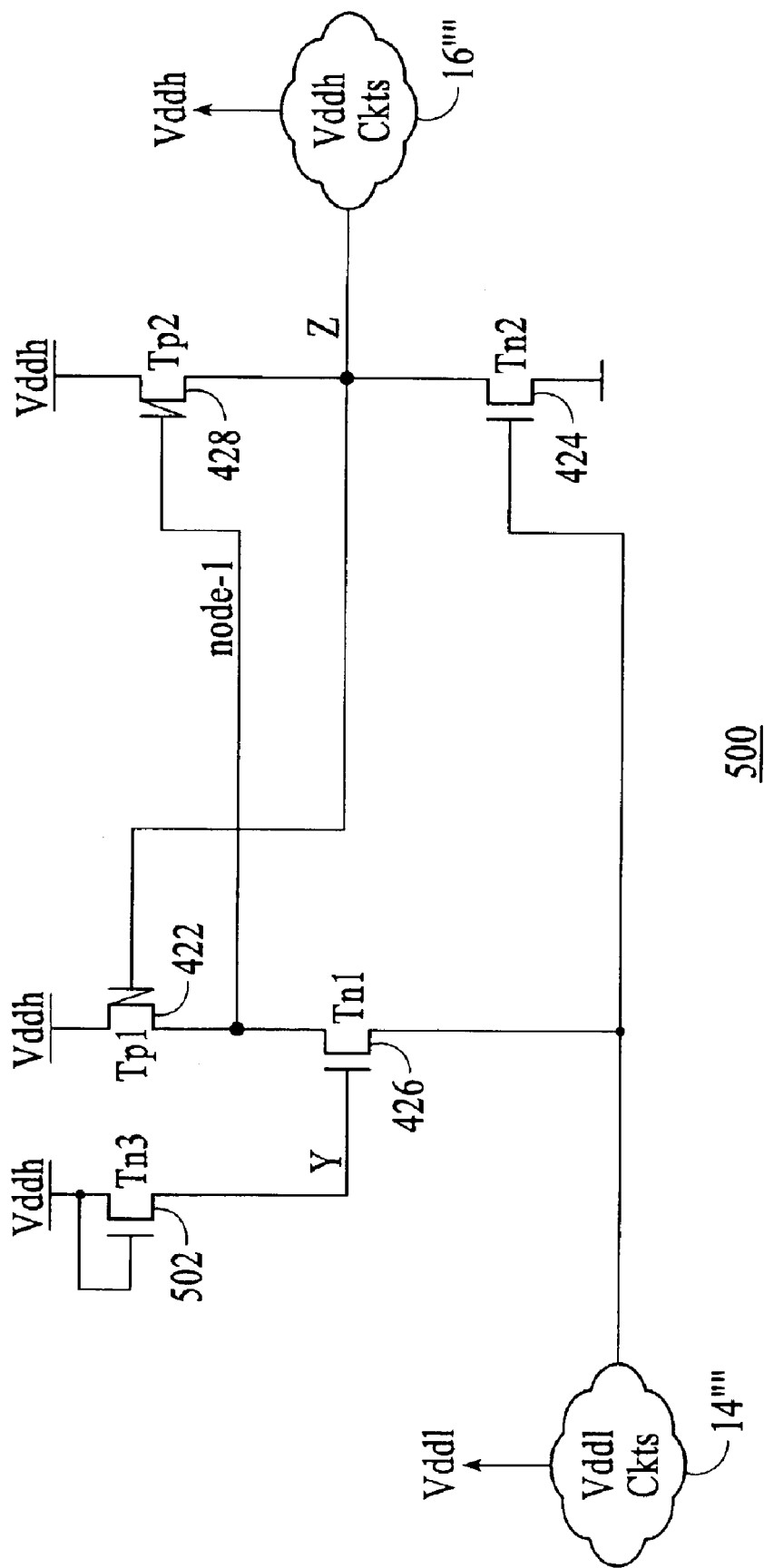
FIG. 6 is an embodiment of a level translator circuit described in a co-pending patent application.

In co-pending U.S. patent application Ser. No. 10/439,362 (2750P) entitled "Level Translator Circuit for Power Supply Disablement," filed on even date herewith and assigned to the assignee of the present application, Applicant has described other level translator circuits which address these problems. FIG. 6 is an embodiment of such a translator circuit 500. In this embodiment, a nfet transistor 502 is coupled to the gate of transistor 426'; and also its drain and gate is tied to Vddh. In this embodiment, there is no Vddl power supply. This circuit behaves as follows: Node Y is held clamped at Vddh−Vtn; when Vddl is deactivated, Vddl=0 volts, then nfet transistor 426' is active and passes a 0 value to node 1, thereby activating pfet transistor 428 which results in node Z rising to Vddh which in turn causes pfet transistor 422 to be turned off. Nfet transistor 424 is also held off by Vddl being turned off. Leakage is minimized in this mode.

Figure 7:
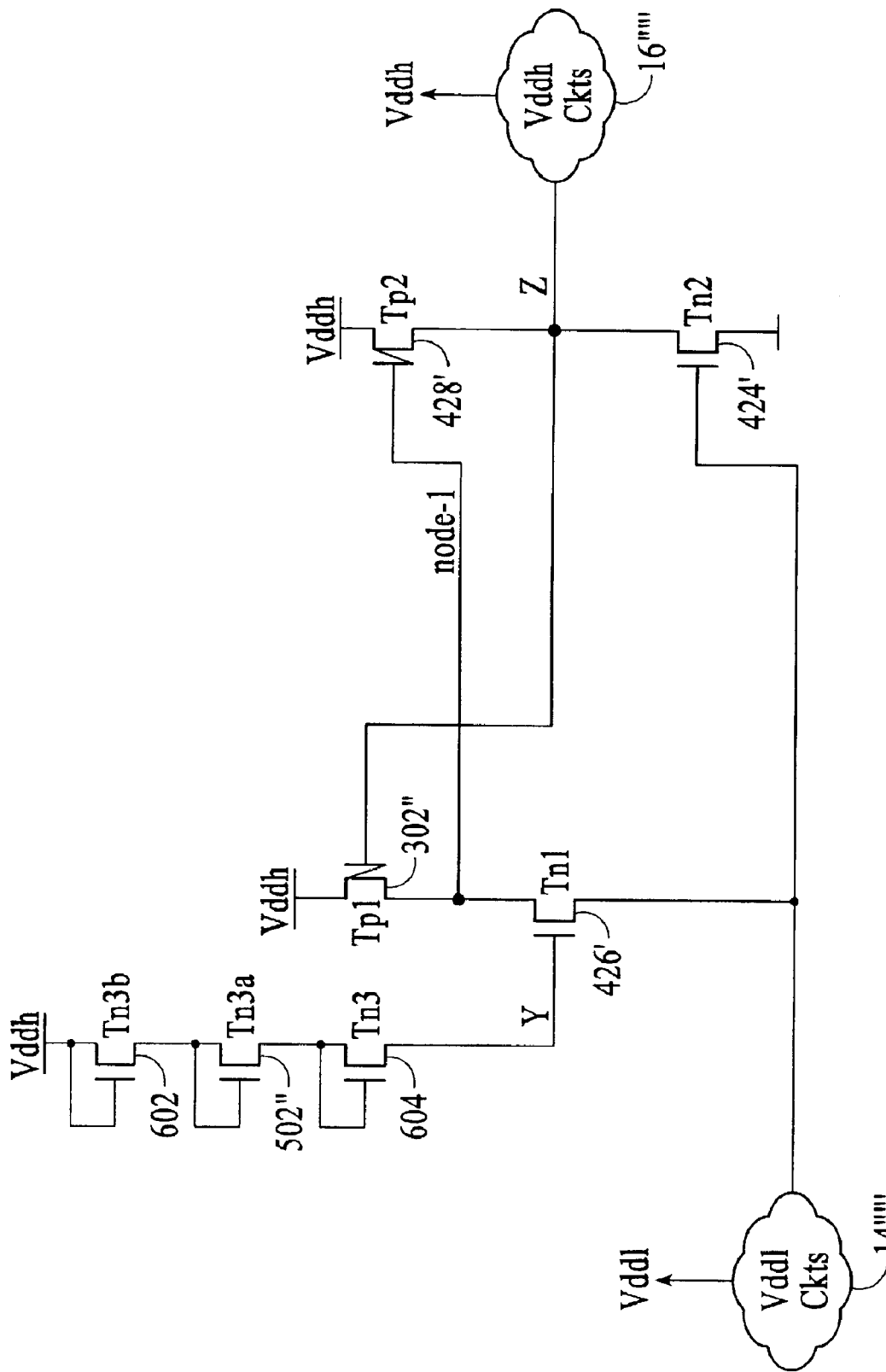
FIG. 7 is another embodiment of a level translator circuit described in the co-pending patent application.

FIG. 7 is a second embodiment of a level translator circuit 600 in accordance with that application. In this embodiment nfet transistors 502'', 602 and 604 are illustrated. These transistors 502'', 602 and 604 allow the delta between Vddl and Vddh to be 3*Vtn as the node Y voltage will be clamped to Vddh−3Vtn.

The combination of alternate or higher Vt devices in conjunction with circuit configurations illustrated in FIGS. 6 and 7 can also be employed. One such configuration is illustrated in FIG. 8.

Figure 8:
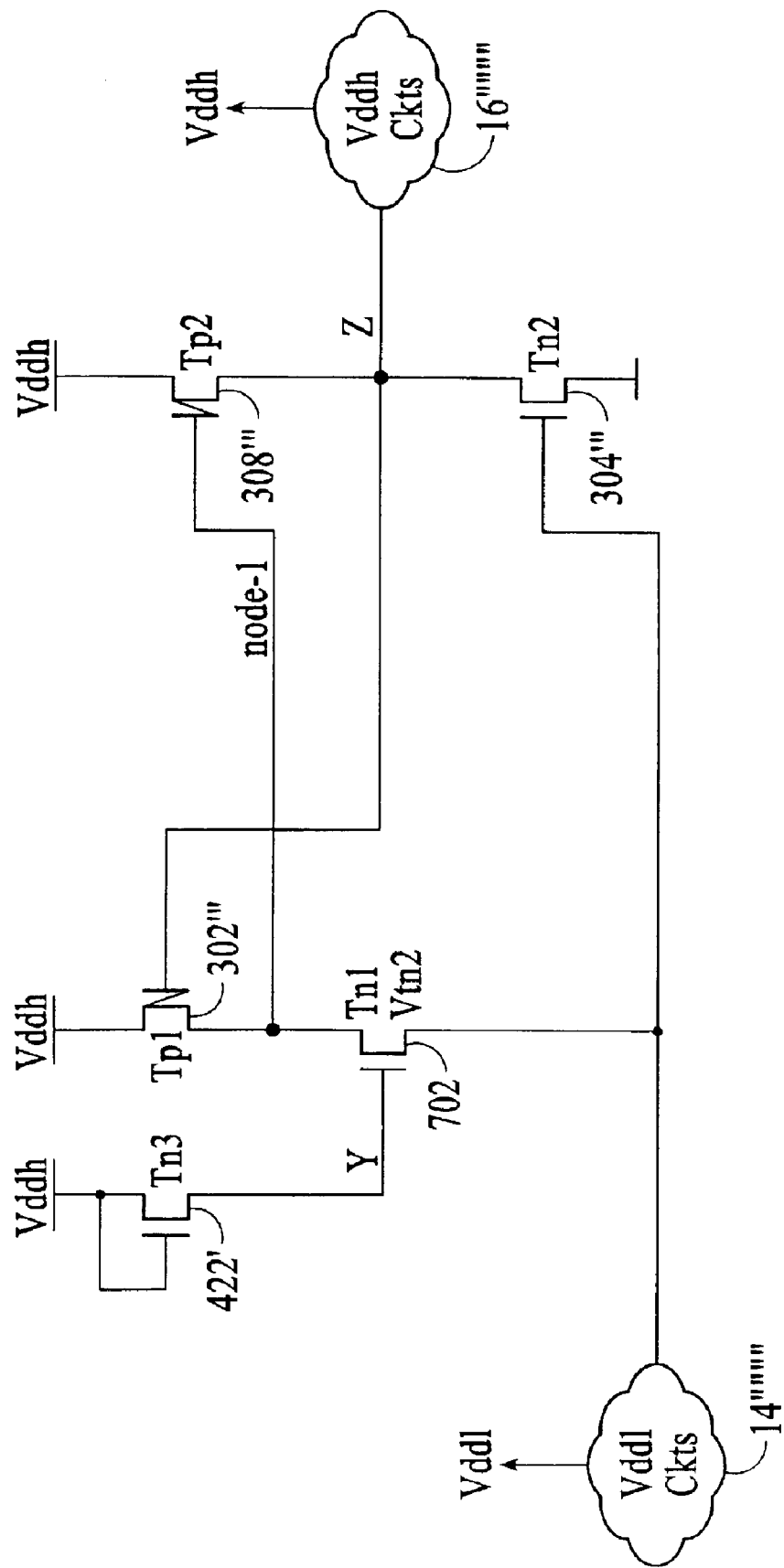
FIG. 8 is a third embodiment of a level translation circuit in accordance with the present invention.

FIG. 8 is a third embodiment of a level translation circuit 700 in accordance with the present invention. In this configuration, nfet transistor 426' is now replaced with a higher threshold transistor 702. This will allow for a larger delta between Vddh and Vddl before leakage current in the active mode becomes of concern. This circuit behaves as follows. Node Y is held clamped at Vddh−Vtn; when Vddl is deactivated, Vddl=0 volts, then nfet transistor 702 is active and passes a '0' value to node 1, thereby activating pfet transistor 308'''which results in node Z rising to Vddh which in turn causes pfet transistor 302''' to be turned off. Nfet transistor 304''' is also held off by Vddl being off. There is no leakage in this mode.

When Vddl is active and a high level is desired to be propagated, then there can be leakage consistent with that of FIG. 6 but now to a lesser degree or to a larger delta between Vddl and Vddh. In this case if Vddh−Vtn−Vtn2 is less than Vddl then no active state leakage will exist. Consistent with the teachings of FIG. 7 adding more nfet transistors 602 and 604 in series with neft transistors 502'' results in no leakage when Vddh−3*Vtn−Vtn2 is less than Vddl.

Accordingly, a level translation circuit is provided that operates effectively even when one of the voltage potential circuits is turned off. In addition, leakage current is minimized for two distinct power supplies by providing a high threshold voltage device within the level translator of the circuit to ensure that an appropriate logical level is provided at the output of the circuit.

Although the present invention has been described in accordance with the embodiments shown, one of ordinary skill in the art will readily recognize that there could be variations to the embodiments and those variations would be within the spirit and scope of the present invention. For example, transistor 422' could be a high threshold device to ensure that the control node of the translator circuit provides the appropriate logic level. Accordingly, many modifications may be made by one of ordinary skill in the art without departing from the spirit and scope of the appended claims.

What is claimed is:

1. A level translator circuit for use between a transmitting voltage potential circuit and a receiving voltage potential circuit; the translator circuit comprising:

a logic element coupled between the transmitting circuit and the receiving circuit for translating the voltage level, wherein the logic element includes a device which has a threshold voltage of such a level that leakage current will be minimized when the transmitting voltage potential circuit's power supply is disabled, wherein the logic element comprises a multi-stage inverter, wherein a first stage of the multi-stage inverter includes an intermediate power supply.

2. The level translator circuit of claim 1 wherein the transmitting voltage potential circuit comprises a lower voltage potential circuit and the receiving voltage potential circuit comprises a higher voltage potential circuit.

3. The level translator circuit of claim 1 wherein the logic element comprises an inverter.

4. The level translator circuit of claim 1 wherein the inverter comprises:

an nfet transistor coupled to the receiving circuit and the transmitting circuit; and a pfet transistor coupled to an nfet transistor, the receiving circuit and the transmitting circuit, wherein the pfet transistor is a high threshold device.

5. A level translator circuit for use between a transmitting voltage potential circuit and a receiving voltage potential circuit; the translator circuit comprising:

a first transistor coupled to the transmitting voltage potential circuit, wherein the first transistor comprises a high threshol 4 device;

a clamping mechanism couple to the first transistor;

a second transistor coupled to the first transistor, a higher voltage potential and the receiving voltage potential circuit;

a third transistor coupled to the receiving voltage potential circuit, the higher voltage potential and the second transistor; and a fourth transistor coupled to the transmitting voltage potential circuit, the receiving voltage potential circuit, and to a ground potential, wherein the clamping mechanism clamps a control node of the translator circuit such that an appropriate logic level is provided to the receiving voltage potential circuit, wherein the high threshold device has a threshold voltage of such a level that leakage current will be minimized when the transmitting voltage potential circuit's power supply is disabled.

6. The level translator circuit of claim 5 wherein the transmitting voltage potential circuit comprises a lower voltage potential circuit and the receiving voltage potential circuit comprises a higher voltage potential circuit.

7. The level translator circuit of claim 5 wherein the clamping mechanism device is coupled to the gate of the first transistor.

8. The level translator circuit of claim 5 wherein the first and fourth transistors comprise nfet transistors and the second and third transistors comprise pfet transistors.

9. The level translator of claim 7 wherein the high threshold device comprises an nfet transistor.

10. A level translator circuit for use between a transmitting voltage potential circuit and a receiving voltage potential circuit; the translator circuit comprising:

a logic element coupled between the transmitting circuit and the receiving circuit for translating the voltage level, wherein the logic element includes a device which has a threshold voltage of such a level that leakage current will be minimized when the transmitting voltage potential circuit's power supply is disabled, wherein the logic element comprises an inverter, wherein the inverter comprises an nfet transistor coupled to the receiving circuit and the transmitting circuit; and a pfet transistor coupled to an nfet transistor, the receiving circuit and the transmitting circuit, wherein the pfet transistor is a high threshold device.

11. The level translator circuit of claim 10 wherein the logic element comprises a multi-stage inverter.

12. The level translator of claim 11 wherein a first stage of the multi-stage inverter includes an intermediate power supply.

\* \* \* \* \*

UNITED STATES PATENT AND TRADEMARK OFFICE
CERTIFICATE OF CORRECTION

| | |
|---|---|
| PATENT NO. | : 6,861,873 B2 |
| APPLICATION NO. | : 10/439860 |
| DATED | : March 1, 2005 |
| INVENTOR(S) | : Anthony Correale, Jr. |

It is certified that error appears in the above-identified patent and that said Letters Patent is hereby corrected as shown below:

<u>Column 5</u>

Line 25, delete "threshol 4" and replace with --threshold--.

Line 26, delete "couple" and replace with --coupled--.

Signed and Sealed this

Nineteenth Day of September, 2006

JON W. DUDAS
*Director of the United States Patent and Trademark Office*